United States Patent [19]

Gregorian et al.

[11] 4,329,599
[45] May 11, 1982

[54] SWITCHED-CAPACITOR COSINE FILTER

[75] Inventors: Roubik Gregorian, Santa Clara, CA; Toshiro Suzuki, Tokyo, Japan

[73] Assignee: American Microsystems, Inc., Santa Clara, Calif.

[21] Appl. No.: 154,573

[22] Filed: May 29, 1980

[51] Int. Cl.³ .................. H03H 11/00; H03F 1/34
[52] U.S. Cl. ........................... 307/520; 307/577; 307/583; 307/497; 330/107; 330/109
[58] Field of Search .............. 328/167, 497; 307/520, 307/584, 577, 578, 583, 353; 330/107, 109

[56] References Cited

U.S. PATENT DOCUMENTS 3,497,716  2/1970  Schmid et al. ............. 328/167 X
4,179,665  12/1979  Gregorian ....................... 330/107

OTHER PUBLICATIONS

IEEE Journal of Solid State Circuits, vol. SC12, No. 6, Dec. 1977, pp. 592-599, "Sampled Analog Filtering Using Switched Capacitor as Resistor Equivalents", by Caves et al.
IEEE Journal of Solid State Circuits, vol. SC12, No. 6, Dec. 1977, pp. 600-608, "MOS Sampled Data Recursive Filters Using Switched Capacitor Integrators", by Hosticka et al.

Primary Examiner—John S. Heyman
Attorney, Agent, or Firm—Alan H. MacPherson; Steven F. Caserza; Richard Franklin

[57] ABSTRACT

A switched-capacitor cosine filter for a sampled-data system functions to reject extraneous frequency components of an incoming analog signal around the sampling frequency, thereby avoiding aliasing. The filter comprises an operational amplifier whose inverting input receives input signals through a switched input capacitor controlled by a four-switch network controlled by alternating clock phases and feedback signals from the amplifier output through a feedback capacitor. The transfer function of the circuit provides a zero of transmission at the sampling frequency, thereby eliminating unwanted frequency components. A self-contained version of the cosine filter is provided by the addition of another grounded switched capacitor with appropriately timed switches in the feedback network.

8 Claims, 4 Drawing Figures

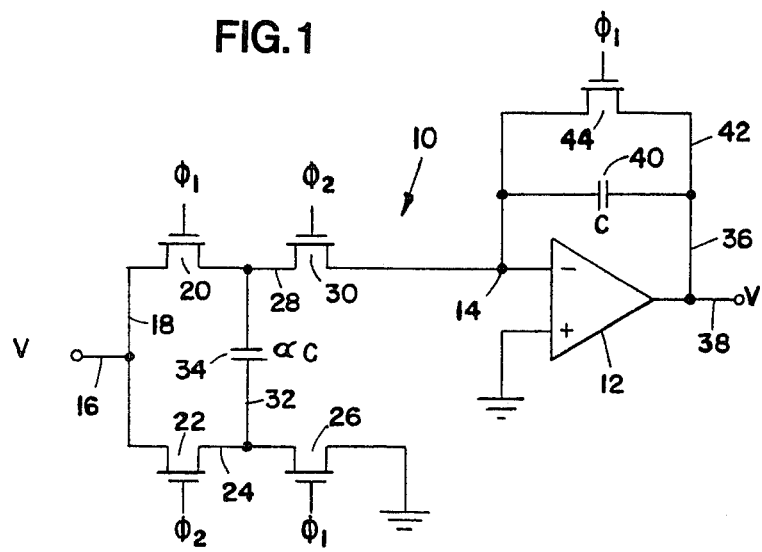
FIG. 1
FIG. 1A
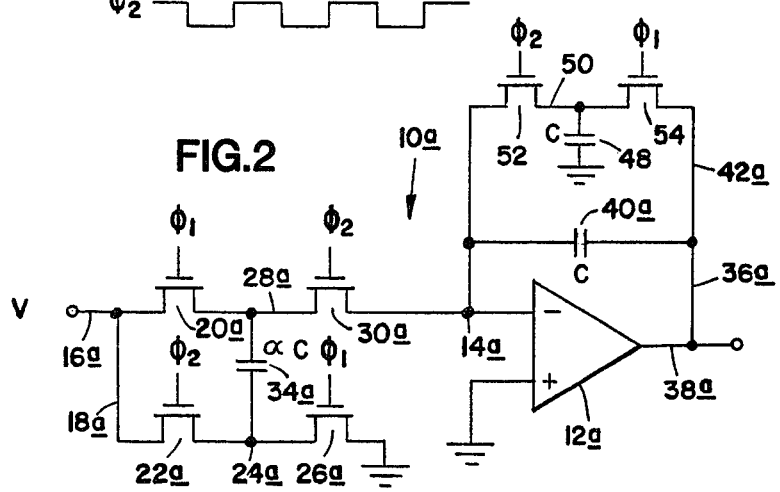
FIG. 2
FIG. 2A

SWITCHED-CAPACITOR COSINE FILTER

BACKGROUND OF THE INVENTION

This invention relates to electronic filtering circuits for sampled-data systems and, more particularly, it relates to a prefilter or cosine filter for a switched capacitor type filter.

In sampled-data systems or devices where the input signal frequency ($F_i$) is in a range that encompasses or is close to the sampling or clock frequency ($F_c$), spurious frequencies can be created by the aliasing or overlapping of signal spectrum giving ($F_c - F_i$) and ($F_c + F_i$) components. One proposed solution to this problem for circuits using charge coupled devices (CCD) is described in IEEE Journal of Solid State Circuits, Vol. SC-12, No. 6, December, 1977. However, the proposed circuitry and its implementation with CCD devices is relatively complex and is not applicable to circuits using metal-oxide-silicon (MOS) devices and employing switched capacitor filters where the same problem existed prior to the present invention.

A switched capacitor filter is a sampled-data system that samples the analog input signal at a given rate. If the signal is not band-limited, all components around the sampling frequency will be folded back into the base-band, causing the aforesaid aliasing problem. In a switched capacitor low-pass filter clocked at ($F_s$), the incoming signal has to be band-limited to ($F_s - F_p$) by an analog prefilter where ($F_p$) is the pass-band edge. If ($F_s$) is low, a complex analog prefilter would be required. However, if the filter is preceded by a cosine filter, the incoming signal can be band-limited to 2 ($F_s - F_p$) externally which relaxes the requirement on the external analog anti-aliasing filter by a factor of 2. It thus becomes necessary to provide circuitry compatible with a switched capacitor filter that would provide the aforesaid cosine filtering function.

BRIEF SUMMARY OF THE INVENTION

The aforesaid problem is solved by the addition of a cosine filter before the actual filter that relaxes the requirements on the external prefilter by a factor of 2, or if two cosine filters are used, relaxes the requirements by a factor of 4. For a single cosine filter, the clock signal used is still ($F_s$), but the signal is sampled at (2 $F_s$). The cosine filter circuit according to the invention comprises an operational amplifier whose inverting input is lead connected to an input node that receives input signals through a switched input capacitor controlled by a four MOSFET switch network controlled by alternating clock phases and feedback signals from the amplifier output through a feedback capacitor. The transfer function of the circuit provides a zero of transmission at the sampling frequency of the filter that follows it. Thus, the cosine filter provides the important function of rejecting the extraneous frequency components of the incoming analog signal around the sampling frequency ($F_s$), thereby avoiding the aliasing problem. In a modified version of the invention, the cosine filter will become a self-contained switched-capacitor cosine filter (and provide a zero at its output at the sampling frequency) with the addition of a third switched capacitor in the feedback section of the operational amplifier.

Other objects, advantages and features of the invention will become apparent from the following detailed description of one embodiment, presented in conjunction with the drawing.

BRIEF DESCRIPTION OF THE DRAWING

FIG. 1 is a circuit for a switched-capacitor cosine filter according to the invention;

FIG. 1a is a timing diagram for alternating clocks for the circuit of FIG. 1;

FIG. 2 is a circuit for a self-contained switched-capacitor cosine filter according to the invention;

FIG. 2a is a timing diagram for the alternating clocks used in the circuit of FIG. 2.

DETAILED DESCRIPTION OF EMBODIMENT

With reference to the drawing, FIG. 1 shows a switched-capacitor cosine filter 10 or prefilter, embodying the principles of the present invention. Briefly, this circuit comprises an operational amplifier 12 whose non-inverting input lead is connected to ground and whose inverting input lead is connected to an input node 14. An input signal voltage ($V_{in}$) in a lead 16 is connected to node 14 through a switched-capacitor network. Thus, lead 16 is connected to a lead 18 that interconnects the source/drain terminals of a pair of MOSFET switch devices 20 and 22 whose gates are connected to alternating phase one and phase two clocks ($\phi_1$) and ($\phi_2$), respectively. The MOSFET 22 is connected by a lead 24 to a third MOSFET switch device 26 whose other source/drain terminal is grounded and whose gate is connected to the phase one clock ($\phi_1$). Similarly, the MOSFET device 20 is connected by a lead 28 to a fourth MOSFET switch 30 whose other source/drain terminal is connected to the input node 14 and whose gate is connected to the phase two clock ($\phi_2$). Extending between the leads 24 and 28 is a lead 32 connected to opposite plates of a capacitor 34 having capacitance value ($\alpha C$).

The operational amplifier 12 has a feedback lead 36 extending from its output lead 38 through a capacitor 40 (having capacitance value C) to node 14. In a parallel lead 42 between the output lead 38 of the operational amplifier 12 and node 14 is a fifth MOSFET switch 44 whose gate is connected to the phase one clock ($\phi_1$).

Assuming that the circuit 10 is connected to the variable signal voltage source ($V_{in}$) which is supplied in lead 16, its operation is as follows: On clock phase one ($\phi_1$), the capacitor 40 in the feedback loop of the operational amplifier 12 is discharged to zero by operation of the switch 44. Simultaneously, the capacitor 34 is charged to the input voltage $V_{in}(nT - T/2)$ since the MOSFET switches 20 and 26 are also operable by the phase one ($\phi_1$) clock. On clock phase two ($\phi_2$), the input signal ($V_{in}$) is directly fed via lead 18 through MOSFET 22 to the bottom plate of the capacitor 34. Simultaneously, the MOSFET switch 30 is closed so that the top plate of the capacitor 34 is connected to the input node 14 and the inverting (−) input to the operational amplifier 12. Thus, the total voltage on the input capacitor 34 is the summation of the input voltages at adjacent half cycles, and the output voltage from the operational amplifier 12 at the end of the phase two ($\phi_2$) clock period is given by:

$$V_o(n) = -\alpha[V_{in}(nT) + V_{in}(nT - T/2)]$$

Or the transfer function is given by:

$$H(z) = V_o(z)/V_{in}(z) = -\alpha(1 + z^{-\frac{1}{2}})$$

The frequency response of this filter is given by:

$$|H(e^{j\omega T})| = \alpha\sqrt{2+2\cos(\omega T)/2}$$

where T is the clock period of the filter that follows the cosine filter.

For $\omega T/2 = \pi$, H=o. This means that the cosine filter has a zero of transmission at the sampling frequency of the filter that follows it. By selecting appropriate sizes for capacitors 34 and 40, the value of the capacitor ratio $\alpha$ can be varied to provide a variable gain cosine filter.

The circuit of FIG. 1 is not a self-contained filter but is intended as a prefilter to be used in combination with another switched capacitor filter as in circuits where such a filter is already available. With a relatively small modification to the circuit 10, a cosine filter 10a that is a self-contained filter discriminator can be provided, as shown in FIG. 2. Here, the elements of the switched capacitor input network are the same as circuit 10, but in the feedback network for an operational amplifier 12a another capacitor 48 is provided in addition to the usual holding capacitor 40a in the feedback lead 36a. This additional capacitor is connected to ground on one side and to a lead 50 between two MOSFET switches 52 and 54 that are interconnected in series in the parallel feedback lead 42a. The gates of these latter switch elements 52 and 54 are controlled by clock phases two ($\phi_2$) and one ($\phi_1$), respectively.

In the operation of the circuit of FIG. 2, the capacitors 40a and 48 have the same capacitance value (C). The input signal ($V_{in}$) charges the first input capacitor 34a on the first clock cycle ($\phi_1$). At this same time the output signal ($V_{out}$) of the circuit is sampled on the feedback capacitor 48. On the next, or phase two ($\phi_2$) clock cycle, the bottom plate of the input capacitor 34a is charged to the input signal and the top plate is connected to the inverting (−) input of the operational amplifier 12a. Therefore, the total voltage on the input capacitor 34a is the summation of the input voltages at adjacent half clock cycles, which to this point, is the same as the operation in the circuit of FIG. 1. However, here the switching feedback capacitor 40a is discharged to ground by virtue of the grounded capacitor 48. Thus, with each clock cycle, the previous charge on the fixed capacitor 40a is cancelled by the switching feedback capacitor 48 and the new or present value is determined by the charge from the input capacitor 34a. This cosine filter 10a is thus "self-contained", because during each half clock period when it is sampling the input signal, the output signal of the cosine filter is still holding (and providing on output lead 38a) the value of the previous sample. This circuit is, therefore desirable where the adjacent connecting circuitry does not include a separate switched capacitor filter capability.

To those skilled in the art to which this invention relates, many changes in construction and widely differing embodiments and applications of the invention will suggest themselves without departing from the spirit and scope of the invention. The disclosures and the description herein are purely illustrative and are not intended to be in any sense limiting.

We claim:

1. A cosine filter for a sampled-data system adapted to reject extraneous frequency components of an incoming analog signal around a sampling frequency so as to avoid aliasing, said filter comprising;
    an operational amplifier having an inverting input lead, a non-inverting input connected to a reference voltage, and an output lead;
    a switched capacitor input network connecting the analog input signal to said inverting input lead of said operational amplifier, said input network including a first capacitor and switch means controlled by complementary first and second signals from a first clock and a second clock so that the total charge on said first capacitor at the end of each clock period is the summation of the input voltages at adjacent half cycles; and
    a feedback network including a first feedback path containing a second capacitor connected between said inverting input lead and the output lead of said operational amplifier, and a second feedback path in parallel with said first feedback path including a switch means controlled by one of said first and second signals.

2. The cosine filter as described in claim 1 wherein said switch means of said input network comprises first and second switches connected in series between the analog signal source and said inverting input lead of said operational amplifier, third and fourth switches connected in series between the analog signal source and said reference voltage; said first capacitor having a first plate connected to a node between said first and second switches and a second plate connected to a node between said third and fourth switches, said first and fourth switches being controlled by said first signal and said second and third switches being controlled by said second signal.

3. The cosine filter as described in claim 1 wherein said switch means of said feedback network comprises a switch controlled by said first clock.

4. The cosine filter as described in claim 1 wherein said switch means of said feedback network comprises a pair of switches connected in series in said second feedback lead; and a third capacitor having a first plate connected to a node between said pair of switches and a second plate connected to said reference voltage.

5. Structure as in claim 4 wherein said second feedback path contains first switch means controlled by one of said first and second signals and second switch means connected in series with said first switch means controlled by the other of said first and second signals, and a third capacitor equal in value to said second capacitor, connected between ground and the node between said first switch means and said second switch means.

6. The cosine filter as in claim 4 wherein said pair of switches comprises
    a first switch controlled by said first signal, said first switch connected between said inverting input lead of said operational amplifier and said node; and
    a second switch controlled by said second signal, said second switch connected between said node and said output lead of said operational amplifier.

7. The structure as in claims 2, 3, 4, 5 or 6 wherein said switches comprise MOSFET devices.

8. The structure as in claims 1, 2, 3, 4 or 5 wherein said first signal and said second signal are of equal frequency and opposite phase.

* * * * *

UNITED STATES PATENT AND TRADEMARK OFFICE
CERTIFICATE OF CORRECTION

PATENT NO. : 4,329,599

DATED : May 11, 1982

INVENTOR(S) : Roubik Gregorian, Santa Clara, CA and
Toshiro Suzuki, Tokyo, Japan It is certified that error appears in the above—identified patent and that said Letters Patent is hereby corrected as shown below:

[73] Assignee: After "American Microsystems, Inc., Santa Clara, California", add --and Hitachi, Ltd., Tokyo, Japan--.

Column 1, line 49, delete "is";

Column 1, line 50, between "lead" and "connected" insert --is--;

Column 3, line 6, delete "H=o" and substitute --H=0--;

Column 3, line 52, between "therefore" and "desirable" insert a comma;

Column 4, line 2, after "comprising" delete ";";

Column 4, line 4, between "input" and "connected" insert --lead--;

Column 4, line 60, delete "claims" and substitute --claim--;

UNITED STATES PATENT AND TRADEMARK OFFICE
CERTIFICATE OF CORRECTION

PATENT NO. : 4,329,599

DATED : May 11, 1982

INVENTOR(S) : Roubik Gregorian, Santa Clara, California and Toshiro Suzuki, Tokyo, Japan It is certified that error appears in the above—identified patent and that said Letters Patent is hereby corrected as shown below:

Column 4, line 62, delete "claims" and substitute --claim--.

Signed and Sealed this

First Day of February 1983

[SEAL]

Attest:

GERALD J. MOSSINGHOFF

Attesting Officer

Commissioner of Patents and Trademarks